(12) United States Patent  (10) Patent No.: US 8,441,860 B2
Goda et al.  (45) Date of Patent: *May 14, 2013

(54) NAND STEP UP VOLTAGE SWITCHING METHOD

(75) Inventors: Akira Goda, Boise, ID (US); Taehoon Kim, Boise, ID (US); Doyle Rivers, Boise, ID (US); Roger Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/366,557

(22) Filed: Feb. 6, 2012

(65) Prior Publication Data

US 2012/0140567 A1 Jun. 7, 2012

Related U.S. Application Data

(60) Continuation of application No. 12/696,279, filed on Jan. 29, 2010, now Pat. No. 8,111,555, which is a division of application No. 11/800,002, filed on May 3, 2007, now Pat. No. 7,656,709.

(51) Int. Cl.
G11C 16/04 (2006.01)

(52) U.S. Cl.
USPC ............ 365/185.19; 365/185.17; 365/185.24; 365/185.22

(58) Field of Classification Search ............ 365/185.019, 365/185.17, 185.22, 185.24
See application file for complete search history.

(56) References Cited

U.S. PATENT DOCUMENTS

| | | |
|---|---|---|
| 5,991,202 A | 11/1999 | Derhacobian et al. |
| 6,937,510 B2 | 8/2005 | Hosono et al. |
| 6,954,378 B2 | 10/2005 | Tanaka |
| 6,954,380 B2 | 10/2005 | Ono et al. |
| 7,042,766 B1 | 5/2006 | Wang et al. |
| 7,057,936 B2 | 6/2006 | Yaegashi et al. |
| 7,061,798 B2 | 6/2006 | Chen et al. |
| 7,095,654 B2 | 8/2006 | Quader et al. |
| 7,324,383 B2 | 1/2008 | Incarnati et al. |
| 7,345,923 B2 | 3/2008 | Kim |
| 7,450,426 B2 | 11/2008 | Li et al. |
| 7,701,772 B2 | 4/2010 | Chae et al. |
| 7,701,775 B2 * | 4/2010 | Kang ........................ 365/185.21 |
| 7,706,189 B2 | 4/2010 | Dong et al. |
| 7,796,430 B2 | 9/2010 | Lutze et al. |
| 7,983,079 B2 * | 7/2011 | Kim ........................ 365/185.03 |
| 2006/0120165 A1 | 6/2006 | Hemink |
| 2008/0101126 A1 | 5/2008 | Hemink et al. |
| 2010/0195387 A1 * | 8/2010 | Park ........................ 365/185.03 |
| 2012/0170364 A1 * | 7/2012 | Jang et al. ................ 365/185.03 |

* cited by examiner

*Primary Examiner* — Connie Yoha
(74) *Attorney, Agent, or Firm* — Leffert Jay & Polglaze, P.A.

(57) ABSTRACT

Methods and memories having switching points for changing Vstep increments according to a level of a multilevel cell being programmed include programming at a smaller Vstep increment in narrow threshold voltage situations and programming at a larger Vstep increment where faster programming is desired.

24 Claims, 5 Drawing Sheets

NAND STEP UP VOLTAGE SWITCHING METHOD

RELATED APPLICATION

This application is a Continuation of U.S. patent application Ser. No. 12/696,279, titled "NAND STEP UP VOLTAGE SWITCHING METHOD," filed on Jan. 29, 2010 now U.S. Pat. No. 8,111,555, which is a divisional of U.S. patent application Ser. No. 11/800,002, filed May 3, 2007, now U.S. Pat. No. 7,656,709, both of which are commonly assigned and incorporated herein by reference.

FIELD

The present disclosure relates generally to semiconductor memories, and in particular the present disclosure relates to NAND type memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space or margin of 0.2V to 0.4V is between each range to keep the Vt distributions from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state is very important. The cell Vt distribution width is related to many variables in the operation of a memory circuit. For example, a cell could be verified at one temperature and read at a different temperature. The circuitry that determines if the cell is erased or programmed to the correct Vt window has to make that determination. That circuitry has some of its characteristics influenced by temperature. A Vt window is a sum of all of these types of differences, translating into a shift in the perceived window of the Vt. In order for the window to operate, the width of the four states plus a margin between each state should amount to the available window.

For the reasons stated above, and for other reasons stated below which will become apparent to those skilled in the art upon reading and understanding the present specification, there is a need in the art for fast programming of multilevel cells with lowered threshold voltage distribution.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Bits of a multilevel cell (MLC) are programmed with a set of programming pulses that increase at each successive pulse by an increment, resulting in the programming of the bits at a specific level. The increment is referred to herein as Vstep. In the various embodiments, Vstep is a smaller increment or a larger increment. With a smaller increment of Vstep, the slope of a line plotting the pulse magnitude for a series of successive pulses has a shallow slope. With a larger increment of Vstep, the slope of the line plotting the pulse magnitude for a series of successive pulses has a steeper slope. Smaller Vstep increments result in programming that takes longer than programming with higher Vstep increments, but the smaller gap between pulse magnitudes allows for the threshold voltage Vt to be narrower in the MLC.

The various method embodiments described herein include methods for switching Vstep from a low increment to a higher increment, for example, to tighten threshold voltage (Vt) distribution and maintain programming time.

Figures 1, 2, 3:
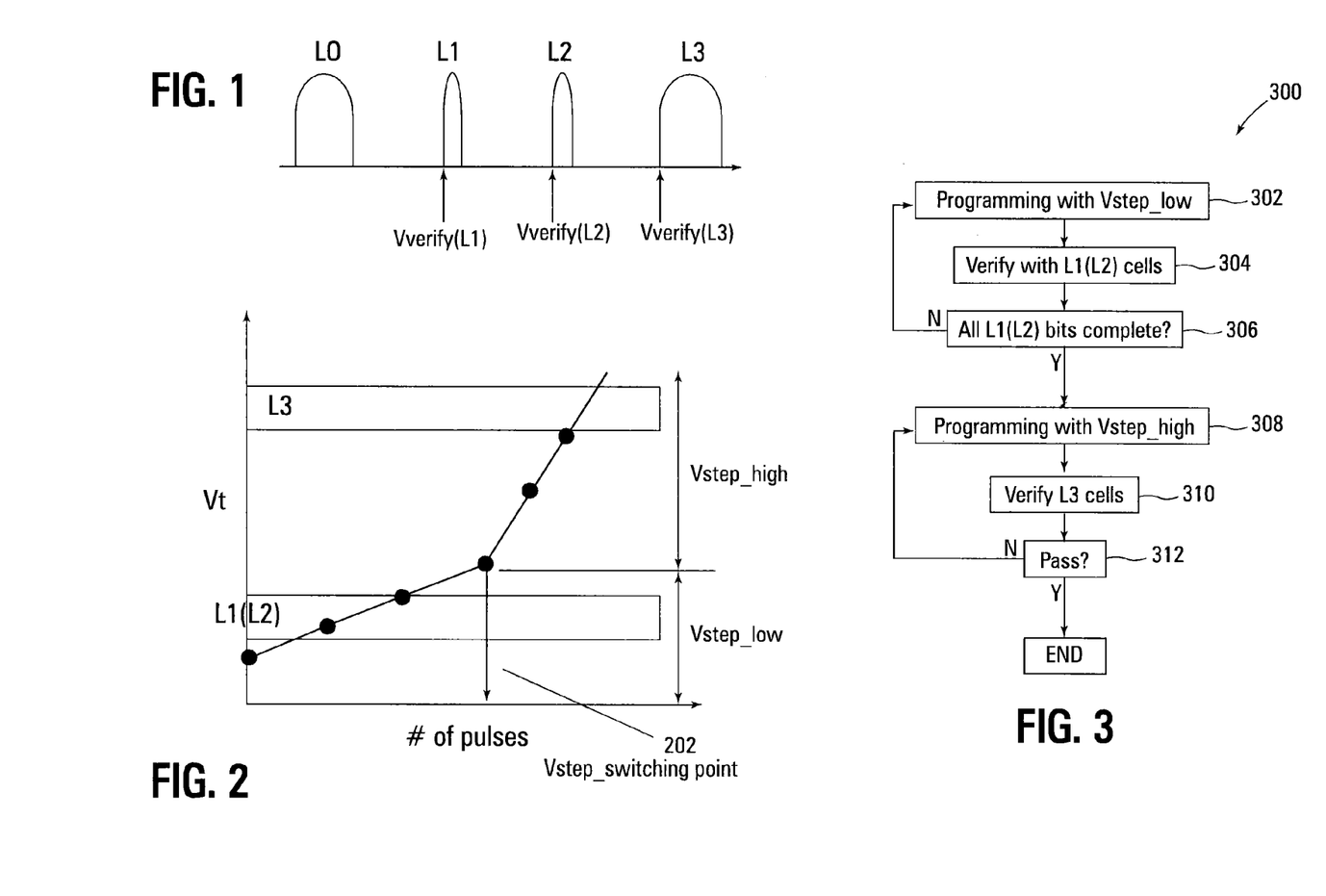
FIG. 1 is a diagram showing threshold voltage distributions for a multiple level memory cell according to one embodiment.
FIG. 2 is a graph of programming pulses versus threshold voltage for one embodiment.
FIG. 3 is a flow chart of a process of programming a multiple bit cell according to one embodiment.

In one embodiment, shown in FIGS. 1, 2, and 3, programming of a multiple level cell (in one embodiment a four level cell having levels 0, 1, 2, and 3) begins with programming using a stepped voltage with a first step voltage increment (Vstep_low). When all level 1 and level 2 cells have been programmed, the Vstep increment is changed to a larger stepped voltage increment (Vstep_high). The level 3 cells are programmed with a series of program pulses using Vstep_high incremental steps in the programming sequence. A determination is made as to when to switch the programming increment from Vstep_low to Vstep_high. This determination is made by monitoring programming of the level 1 and level 2 bits. When all of the level 1 and level 2 bits have been programmed, the step increment of the programming pulses is increased to the Vstep_high value, and programming continues until all level 3 bits are programmed. The increase of the slope of the programming pulse value allows for faster programming of the level 3 cells. In an alternate embodiment, the Vstep switching point 202 is determined as part of a trim set for the memory, and is pre-programmed.

One embodiment 300 of switching from a low slope Vstep to a higher slope Vstep is shown in flowchart form in FIG. 3. Method 300 for switching begins programming with Vstep_low in block 302. Verification of level 1 (and level 2) bits is in block 304, and if all level 1 bits (or all level 1 and 2 bits) are verified as programmed, decision block 306 switches programming for level 3 bits to Vstep_high in block 308. If all level 1 bits (or all level 1 and 2 bits) are not verified, process flow continues at block 302. Once all level 3 cells are verified in block 310, and decision block 312 determines that all level 3 bits have passed, the process ends.

Figure 4:
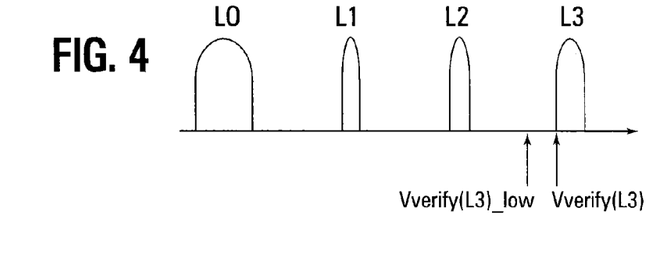
FIG. 4 is a diagram showing threshold voltage distributions for a multiple level memory cell according to another embodiment.
Figure 5:
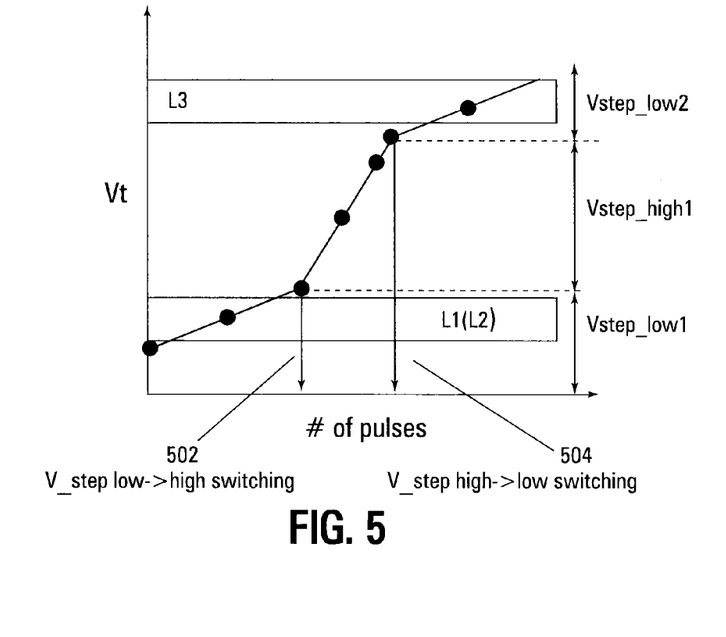
FIG. 5 is a graph of programming pulses versus threshold voltage for another embodiment.
Figure 6:
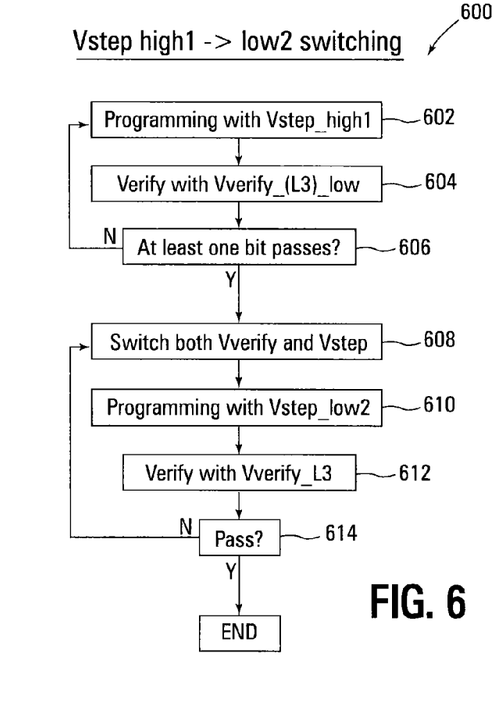
FIG. 6 is a flow chart of a process of programming a multiple bit cell according to another embodiment.

In another embodiment shown in FIGS. 4, 5, and 6, the level 1 and level 2 bits are programmed as has been described above, and when all level 1 and level 2 bits are verified as programmed, the Vstep increment is increased as described above. However, the increased step-up voltage increment is once again reduced to a smaller increment when at least one level 3 bit has been verified. This is accomplished as described below.

In this embodiment, two verify levels are used for verifying the level 3 bits. The first verify voltage is a traditional verify voltage that is used to verify level 3 bits for the memory that is being programmed. This verify voltage is set based on parameters of the memory and the like and is referred to herein as VverifyL3. The second verify voltage is an increment lower than the first verify voltage and is referred to herein as VverifyL3_low. It is used only in the determination of when to switch the step-up voltage increment from its larger increment back to a smaller increment.

The various embodiments allow a tighter Vt distribution without sacrificing programming time. With a larger step up increment, programming bits is faster since the voltages are higher, but threshold distributions are wider. Using a smaller step up increment tightens threshold voltage distribution, but programming takes longer because of lower programming voltages. For lower level bits, such as levels 1 and 2, with tighter threshold voltage distributions, a slower programming is acceptable. Fir higher level bits, such as level 3 bits, threshold voltage distributions are typically somewhat wider, and faster programming is acceptable.

The various embodiments disclosed herein use two to three different slopes of the step-up voltage pulses, shown in greater detail in FIGS. 2 and 5, a first, smaller increment for programming at the lower levels, and then a larger step-up voltage increment for higher levels, or a larger step-up voltage for mid levels and a smaller increment again for upper levels.

In the first embodiment shown in FIGS. 1, 2, and 3, and especially FIG. 1, the levels of level 1 and level 2 bits are closely spaced. Programming begins with a Vt lower than level 1, with successively increasing voltages used for programming. At the Vstep switching point 202, shown in FIG. 2, the slope of the step-up increment becomes larger (Vstep switches from Vstep_low to Vstep_high).

The representative cells shown herein have four levels. It should be understood that the various embodiments are amenable to use with fewer or greater numbers of levels in the cells.

Potential overprogramming issues may occur in this type of cell. To improve overprogramming, lower programming voltages and step-up voltages are used in one embodiment for level 1 bits, because otherwise, the first or second pulse is higher than level 1.

In the embodiment shown in FIGS. 4, 5, and 6, two switching points 502 and 504 are used. This embodiment uses a shallow slope for level 1 and for level 3 bit programming, but has a Vstep_high series of programming pulses between level 2 and level 3, so it uses two different slope changes. The first change is from a smaller increment of Vstep as has been described above, to a larger slope (Vstep_low to Vstep_high), and the second change is from the larger slope to a smaller slope once a particular condition has been met (Vstep_high to Vstep_low2). That condition in one embodiment is the verification of the programming of at least one level 3 bit. In another embodiment, the condition is the verification of at least a predetermined number of level 3 bits passing programming. This level can be set based on user comfort or to within certain margins of reliability, for example. In yet another embodiment, the condition is a predetermined number of level 3 bits per page of the memory passing verification. This level can also be set based on user comfort or to within certain margins of reliability.

To determine the step up changing point from Vstep_high to Vstep_low2, verification is undertaken with a verify voltage lower than the normal verify voltage for level 3 bits for the normal verify voltage for level 3 (VverifyL3_low). Once at least one level 3 bit is verified as programmed (or on other embodiments a predetermined number of level 3 bits, or a predetermined number of level 3 bits per page), the step up voltage increment is changed to a smaller increment, and the verify voltage is changed to the normal verify voltage for the level 3 bits. VverifyL3_low is used until the programming condition for level 3 bits is met. Once the condition is met, the verify voltage is switched from VverifyL3_low to VverifyL3, and level 3 bit verification proceeds with VverifyL3.

The threshold from switching from Vstep_low to Vstep_high is the same in second embodiment as in first. Changing the step up voltage from high increment to lower increment is accomplished as follows. To verify the programming of level three cells, a verify voltage is used. Use of verify voltages to verify programming of a cell is known. However, in this embodiment, two different verify voltages are used for level 3 bits. The first verify voltage (VverifyL3) is the typical verify voltage used for verifying that all level 3 cells have been programmed, and is determined by the characteristics of the cells. The second verify voltage (VverifyL3_low) is lower than the typical verify voltage for the level 3 cells, in one embodiment by approximately 100-200 milliVolts lower than the typical verify voltage. This verify voltage is used with the Vstep_high programming pulse increment until at least one level 3 bit is verified as programmed. At that time, the Vstep increment is changed the second time, to a smaller increment for programming the remaining level 3 bits. This allows for faster programming. In an alternate embodiment, one or both of the Vstep switching points 502 and 504 are determined as part of a trim set for the memory, and are pre-programmed.

One embodiment 600 of switching from a high slope Vstep to a lower slope Vstep, as described above, is shown in greater detail in FIG. 6. Method 600 for switching uses a verify voltage VverifyL3 low that is lower than the verify voltage used for complete verification of level 3 bits in the memory. While programming with Vstep_high as shown in block 602, verify is attempted with the lower VverifyL3_low voltage in block 604. Decision block 606 continues programming with Vstep_high until at least one level 3 bit passes with the lower VverifyL3_low voltage. When at least one bit passes, process flow continues with block 608, in which VverifyL3 is switched to the typical verify voltage for level 3 bits, and Vstep is lowered to have a smaller step increment. Programming continues with Vstep_low2 in block 610. Verifying using VverifyL3_low proceeds in block 612, and in decision block 614, it is determined whether all level 3 bits are programmed (using VverifyL3). Until all level 3 bits are verified with the higher VverifyL3 voltage, process flow is re-directed to block 610. When all level 3 bits are verified with the VverifyL3 voltage, process flow ends.

Figure 7:
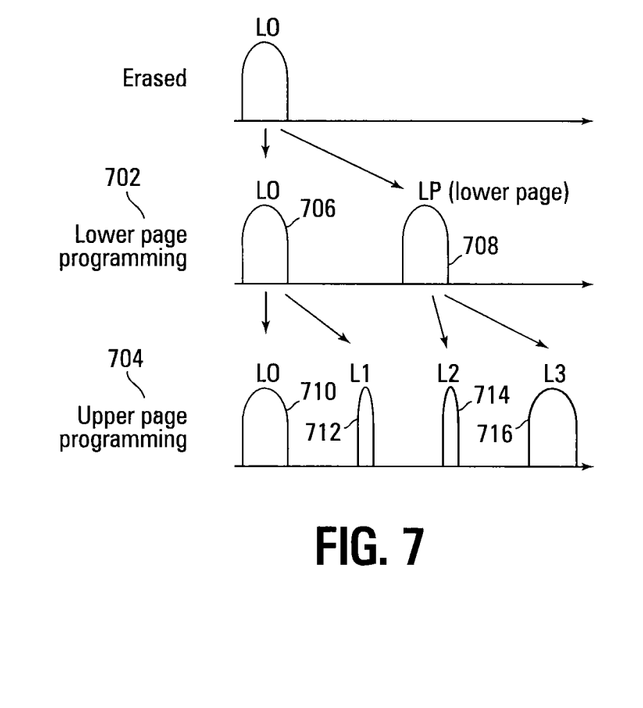
FIG. 7 is a diagram showing threshold voltage distributions for a multiple level memory cell according to another embodiment.

In another embodiment, shown in FIG. 7, a multilevel cell is programmed in two sequences, the first for a lower page 702 and the second for an upper page 704. Lower and upper page programming each program two levels, and upper page programming programs each of those two initial levels to two levels, for a total in this embodiment of four levels. Lower page programming programs two threshold voltage levels 706 and 708. Once lower page programming is completed, upper page programming is done. This upper page programming uses one of the methods of programming discussed above with respect to FIGS. 1-3 FIGS. 4-6. Upper page programming programs level 706 to levels 710 and 712, and programs level 708 to levels 714 and 716. Such an embodiment helps with potential timing issues due to a small distance between the threshold levels of bits in level 2 and bits in level 3.

Figure 8:
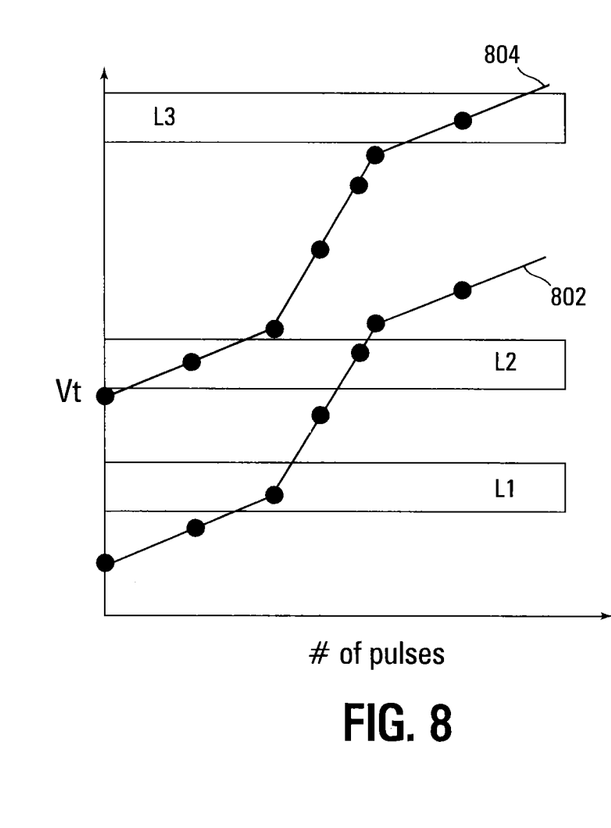
FIG. 8 is a graph of programming pulses versus threshold voltage for another embodiment.

FIG. 8 shows further the upper page programming of the embodiment described in FIG. 7, with respect to threshold voltage programming levels and Vstep increments. The method of programming a cell with upper and lower page programming as described above includes performing a first programming on the cell to program a first two levels of threshold voltage (levels 706 and 708), and then programming each of the first two levels to two additional levels (710/712 and 714/716) of threshold voltage. Then, as is shown in FIG. 8, the pulse graph lines 802 and 804 show upper page programming. Programming of the L0 and L1 (710 and 712) levels is accomplished using voltage pulses as shown in graph line 802 Then, programming of the L2 and L3 levels is accomplished using voltage pulses as shown in graph line 804, with a higher starting threshold voltage for the upper page programming for levels L2 and L3 Programming of the L2 and L3 (714 and 716) levels. In other various embodiments, the embodiments of FIGS. 7-8 can be implemented in combination with the embodiments of FIGS. 1-3 or of FIGS. 4-6.

Figure 9:
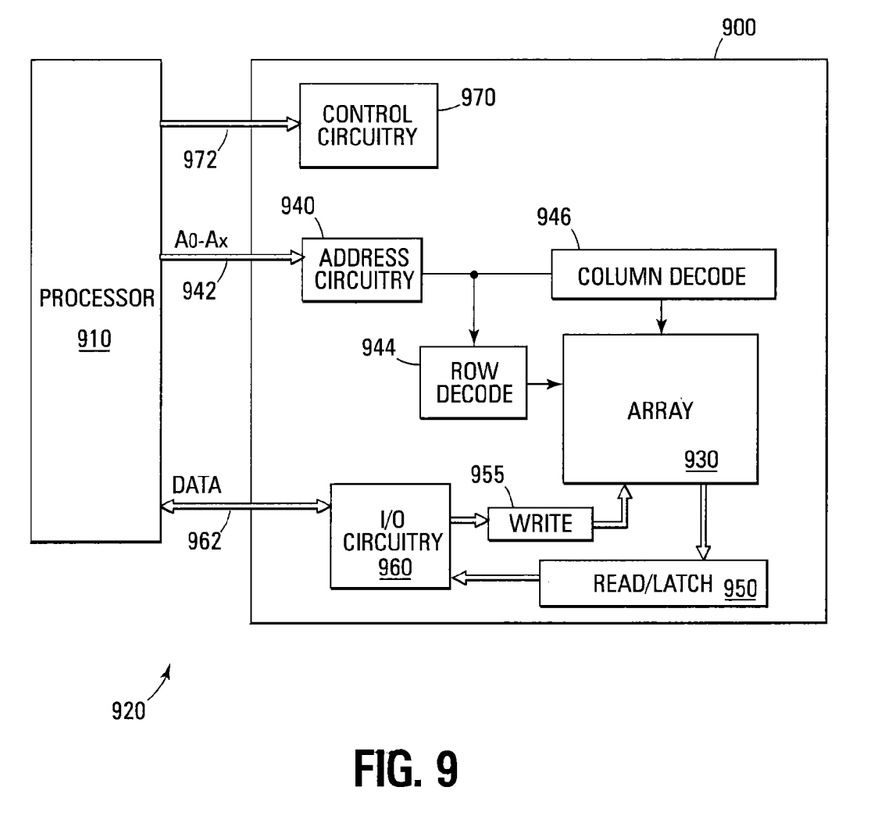
FIG. 9 is a functional block diagram of an electrical system having at least one memory device with a memory array configuration according to one embodiment of the present invention.

FIG. 9 is a functional block diagram of a memory device 900, such as a flash memory device, of one embodiment of the present invention, which is coupled to a processor 910. The memory device 900 and the processor 910 may form part of an electronic system 920. The memory device 900 has been simplified to focus on features of the memory that are helpful in understanding the present invention. The memory device includes an array of memory cells 930 having multiple bits per cell, the cells programmed using one of the Vstep switching methods such as those shown in FIGS. 1-8 and described above. The memory array 930 is arranged in banks of rows and columns.

An address buffer circuit 940 is provided to latch address signals provided on address input connections A0-Ax 942. Address signals are received and decoded by row decoder 944 and a column decoder 946 to access the memory array 930. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 930 by sensing voltage or current changes in the memory array columns using sense/latch circuitry 950. The sense/latch circuitry, in one embodiment, is coupled to read and latch a row of data from the memory array. Data input and output buffer circuitry 960 is included for bi-directional data communication over a plurality of data (DQ) connections 962 with the processor 910, and is connected to write circuitry 955 and read/latch circuitry 950 for performing read and write operations on the memory 900.

Command control circuit 970 decodes signals provided on control connections 972 from the processor 910. These signals are used to control the operations on the memory array 930, including data read, data write, and erase operations. The flash memory device has been simplified to facilitate a basic understanding of the features of the memory. A more detailed understanding of internal circuitry and functions of flash memories are known to those skilled in the art.

Figure 10:
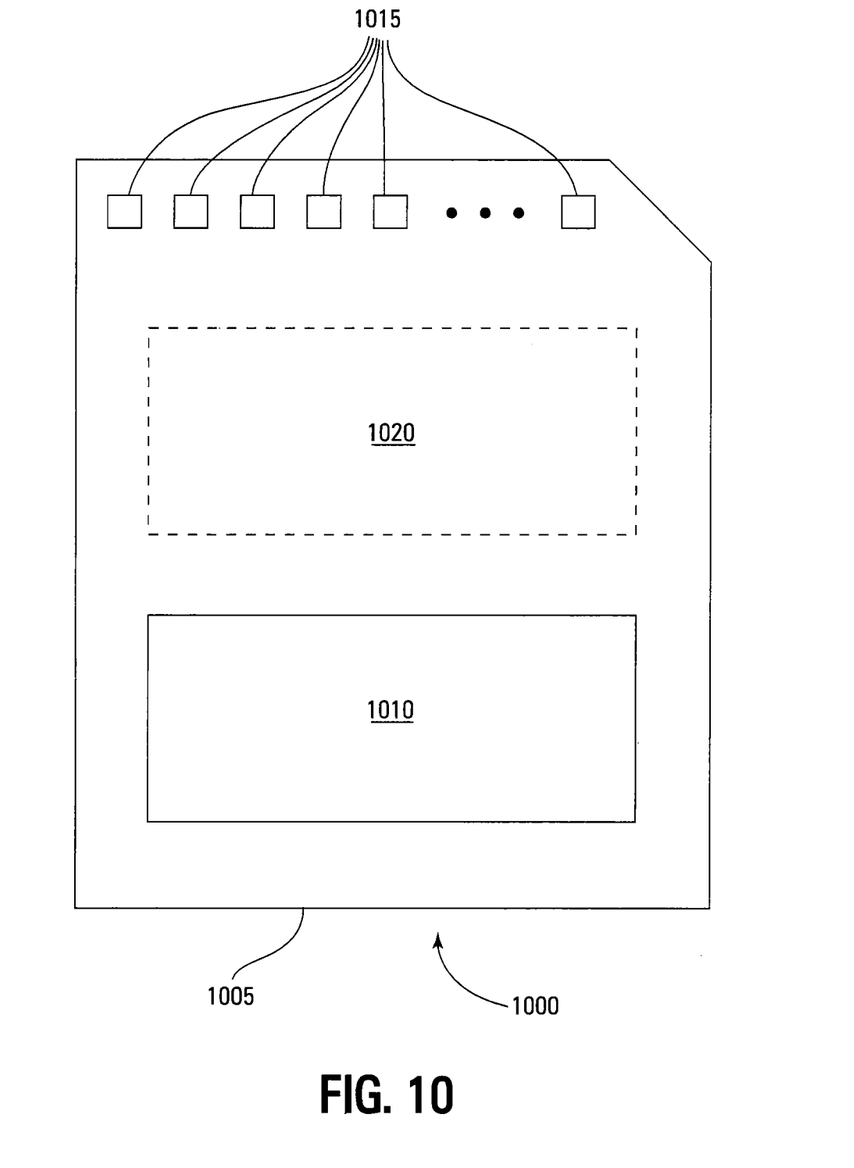
FIG. 10 is a functional block diagram of a memory module having at least one memory device in accordance with an embodiment of the invention.

FIG. 10 is an illustration of an exemplary memory module 1000. Memory module 1000 is illustrated as a memory card, although the concepts discussed with reference to memory module 1000 are applicable to other types of removable or portable memory, e.g., USB flash drives, and are intended to be within the scope of "memory module" as used herein. In addition, although one example form factor is depicted in FIG. 10, these concepts are applicable to other form factors as well.

In some embodiments, memory module 1000 will include a housing 1005 (as depicted) to enclose one or more memory devices 1010, though such a housing is not essential to all devices or device applications. At least one memory device 1010 is a non-volatile memory including multi-level cells and Vstep switching programming methods such as those described above and according to various embodiments of the present invention. Where present, the housing 1005 includes one or more contacts 1015 for communication with a host device. Examples of host devices include digital cameras, digital recording and playback devices, PDAs, personal computers, memory card readers, interface hubs and the like. For some embodiments, the contacts 1015 are in the form of a standardized interface. For example, with a USB flash drive, the contacts 1015 might be in the form of a USB Type-A male connector. For some embodiments, the contacts 1015 are in the form of a semi-proprietary interface. In general, however, contacts 1015 provide an interface for passing control, address and/or data signals between the memory module 1000 and a host having compatible receptors for the contacts 1015.

The memory module 1000 may optionally include additional circuitry 1020 which may be one or more integrated circuits and/or discrete components. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of I/O connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC (application specific integrated circuit). Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

Methods and memories have been described that include switching Vstep programming voltage increments and slopes of the programming pulse progression to allow for example tightened threshold voltages while maintaining fast programming times.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for programming a memory, the method comprising:
   programming at least one of a plurality of states of a multiple state memory with a first series of programming pulses having a first step-up voltage gap;
   changing the gap of the first step-up voltage gap to a second larger gap in response to programming the at least one of the plurality of states;
   changing the gap of the second step-up voltage gap to a third smaller gap at a determined gap changing point; and
   programming at least one of a remaining plurality of states of the multiple state memory with a series of programming pulses having the third step-up voltage gap;
   wherein changing the gap of the second step-up voltage comprises switching to the third gap when a predetermined verify condition for at least one of the remaining plurality of states of the multiple state memory is verified at a first verify voltage.

2. The method of claim 1, further comprising partially programming at least one of a remaining plurality of states of the multiple state memory with the series of programming pulses having the second step-up voltage gap.

3. The method of claim 1, wherein the first verify voltage comprises a verify voltage lower than a full verify voltage for the at least one of the remaining plurality of states of the multiple state memory.

4. A method for programming a memory, the method comprising:
   programming at least one of a plurality of states of a multiple state memory with a first series of programming pulses having a first step-up voltage gap;
   changing the gap of the first step-up voltage gap to a second larger gap in response to programming the at least one of the plurality of states;
   changing the gap of the second step-up voltage to a third smaller gap at a determined gap changing point; and
   programming at least one of a remaining plurality of states of the multiple state memory with a series of programming pulses having the third step-up voltage gap;
   wherein changing the gap of the second step-up voltage comprises:
      attempting to verify at least one memory cell of the memory using a verify voltage lower than a full verify voltage for the at least one of the remaining plurality of states of the multiple state memory; and
      switching to the third gap when a predetermined verify condition for at least one of the remaining plurality of states of the multiple state memory is verified at the low verify voltage.

5. The method of claim 4, wherein the predetermined verify condition comprises verifying the at least one memory cell at the low verify voltage.

6. The method of claim 4, wherein the predetermined verify condition comprises verifying a predetermined number of the at least one memory cells at the low verify voltage.

7. The method of claim 4, further comprising continuing to program the at least one of the remaining plurality of states and attempting to verify one or more memory cells of the memory using the full verify voltage.

8. A method for programming memory cells, the method comprising:

using a stepped voltage having a first step voltage increment to program a first memory cell to a first level and changing the step voltage increment of the stepped voltage to a second step voltage increment responsive to the first memory cell being programmed to the first level;

using the stepped voltage having the second step voltage increment to partially program a second memory cell to a second level;

attempting to verify the second memory cell using a verify voltage lower than a full verify voltage for the second level; and using the stepped voltage having a third step voltage increment to complete programming of the second memory cell to the second level.

9. The method of claim 8, wherein the second step voltage increment is changed to the third step voltage increment in response to verifying the second memory cell using the low verify voltage.

10. The method of claim 8, wherein the second step voltage increment is larger than the first step voltage increment and the third step voltage increment.

11. The method of claim 8, wherein partially programming the second memory cell comprises increasing a threshold voltage of the second memory cell.

12. The method of claim 8, further comprising attempting to verify the second memory cell using the full verify voltage for the second level.

13. The method of claim 12, wherein attempting to verify the second memory cell using the full verify voltage further comprises attempting to verify the second memory cell using the full verify voltage by comparing a threshold voltage of the second memory cell with the full verify voltage.

14. The method of claim 8, wherein the full verify voltage is approximately 100-200 milliVolts greater than the low verify voltage.

15. The method of claim 8, wherein attempting to verify the second memory cell using the low verify voltage further comprises attempting to verify the second memory cell using the low verify voltage by comparing a threshold voltage of the second memory cell with the low verify voltage.

16. A memory device, comprising:
an array of memory cells; and
control circuitry, wherein the control circuitry is configured to:
program a first state of a plurality of states in one or more memory cells of the memory array with a first series of programming pulses having a first step-up voltage gap;
change the gap of the first step-up voltage gap to a second larger gap in response to programming the first state of the plurality of states;
change the gap of the second step-up voltage gap to a third smaller gap at a determined gap changing point; and
program a second state of the plurality of states in one or more memory cells of the array with a series of programming pulses having the third step-up voltage gap;
wherein the gap of the second step-up voltage is changed to the third gap when a predetermined verify condition for the second state of the plurality of states is verified at a first verify voltage.

17. The memory device of claim 16, wherein the predetermined verify condition comprises a condition wherein one or more memory cells have been verified at the first verify voltage.

18. The memory device of claim 16, wherein the first verify voltage comprises a voltage lower than a full verify voltage of the second state of the plurality of states.

19. The memory device of claim 18, wherein the first verify voltage comprises a voltage approximately 100-200 milliVolts lower than the full verify voltage of the second state of the plurality of states.

20. The memory device of claim 16, wherein the array of memory cells comprises an array of NAND flash memory cells.

21. The memory device of claim 16, wherein the array of memory cells comprise an array of multilevel memory cells.

22. A memory device, comprising:
a plurality of memory cells; and
control circuitry, wherein the control circuitry is configured to:
use a stepped voltage having a first step voltage increment to program a first memory cell to a first level and change the step voltage increment of the stepped voltage to a second step voltage increment responsive to the first memory cell being programmed to the first level;
use the stepped voltage having the second step voltage increment to partially program a second memory cell to a second level;
perform a first verify operation on the second memory cell using a verify voltage lower than a full verify voltage for the second level; and
use the stepped voltage having a third step voltage increment to complete programming of the second memory cell to the second level.

23. The memory device of claim 22, wherein the control circuitry is further configured to perform a second verify operation on the second memory cell using the full verify voltage for the second level.

24. The memory device of claim 22, wherein the control circuitry is further configured to use the stepped voltage having the third voltage step responsive to the first verify operation performed on the second memory cell.

* * * * *